US008625871B2

(12) United States Patent
Grimm et al.

(10) Patent No.: US 8,625,871 B2
(45) Date of Patent: Jan. 7, 2014

(54) METHOD FOR PROCESSING MAGNETIC RESONANCE IMAGES AND APPARATUS FOR PROCESSING MAGNETIC RESONANCE IMAGES

(75) Inventors: Robert Grimm, Schwabach (DE); Guo Bin Li, Shenzhen (CN); Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 56 days.

(21) Appl. No.: 13/422,034

(22) Filed: Mar. 16, 2012

(65) Prior Publication Data

US 2012/0237100 A1    Sep. 20, 2012

(30) Foreign Application Priority Data

Mar. 18, 2011    (CN) .......................... 2011 1 0066142

(51) Int. Cl.
*G06K 9/00* (2006.01)
(52) U.S. Cl.
USPC .......................................... 382/131; 382/128
(58) Field of Classification Search
USPC .......................................... 382/128, 131, 132
See application file for complete search history.

(56) References Cited

U.S. PATENT DOCUMENTS

| 6,201,393 | B1 * | 3/2001 | Bernstein et al. | 324/309 |
| 6,288,544 | B1 * | 9/2001 | Bernstein et al. | 324/309 |
| 6,560,353 | B1 * | 5/2003 | Haacke et al. | 382/128 |
| 6,794,869 | B2 * | 9/2004 | Brittain | 324/309 |
| 7,202,666 | B2 * | 4/2007 | Wang et al. | 324/309 |
| 7,917,191 | B2 * | 3/2011 | Kirsch | 600/410 |
| 8,384,385 | B2 * | 2/2013 | Gross | 324/309 |
| 2011/0267053 | A1 | 11/2011 | Li et al. | |

FOREIGN PATENT DOCUMENTS

CN    102236083    11/2011

\* cited by examiner

*Primary Examiner* — Tom Y Lu
(74) *Attorney, Agent, or Firm* — Harness, Dickey & Pierce, P.L.C.

(57) ABSTRACT

In an embodiment, a method is disclosed which includes: carrying out interpolation by using a slice away from a slab boundary, and substituting a slice having slab boundary artifacts existing in the slab boundary, to obtain an interpolated image; carrying out Fourier transform on the interpolated image to generate first K-space data; carrying out Fourier transform on the original image to generate second K-space data; merging the first K-space data with the second K-space data, wherein the weight of the first K-space data is greater than that of the second K-space data in the middle of the K-space, and the weight of the second K-space data is greater than that of the first K-space data at the edge of the K-space; and carrying out inverse Fourier transform on the merged K-space data.

13 Claims, 5 Drawing Sheets

METHOD FOR PROCESSING MAGNETIC RESONANCE IMAGES AND APPARATUS FOR PROCESSING MAGNETIC RESONANCE IMAGES

PRIORITY STATEMENT

The present application hereby claims priority under 35 U.S.C. §119 to Chinese patent application number CN 201110066142.4 filed Mar. 18, 2011, the entire contents of which are hereby incorporated herein by reference.

FIELD

At least one embodiment of the present invention generally relates to the technical field of magnetic resonance imaging (MRI) and, particularly, to a method for processing a magnetic resonance image, an apparatus for processing a magnetic resonance, a computer program for implementing the method and/or a computer-readable record medium for storing said program.

BACKGROUND

The magnetic resonance imaging technology has been widely applied to many fields for detecting the internal structures of objects. The principles of magnetic resonance imaging are as follows: after an external magnetic field has been applied, radio frequency (RF) pulses are used to excite the protons in a tissue under examination, the protons absorb certain energy to resonate; after the RF pulse emission has been stopped, the excited protons gradually release the absorbed energy in the form of signals which are then acquired, and a scanned image of the object under examination can be obtained by processing the signals using the image reconstruction technology. In the three-dimensional MRI imaging technology, the protons in a tissue under examination are excited by having a slab taken as a unit and each slab includes several slices.

The three-dimensional turbo spin echo (3D-TSE) imaging method is a commonly used imaging method in three-dimensional MRI technology, and FIG. 1 is a schematic diagram of the 3D-TSE imaging method in the prior art. Generally, the time interval between two adjacent selective excitation pulses is referred to as the repetition time (TR), and one TR includes an acquisition window (as shown by hatched portion in the figure) and a waiting time (as shown by blank blocks in the figure).

FIG. 1 shows two TRs. As shown in FIG. 1, in the acquisition window of the first TR, a selective excitation pulse is first used to excite a current slab, and then a plurality of non-selective refocusing pulses are applied thereto, in which the angles of the refocusing pulses can be identical or different. When the angles of the refocusing pulses are identical, then it is the conventional 3D-TSE imaging technology; while when the angles of the refocusing pulses are different, the 3D-TSE imaging technology having this feature is generally referred to as the imaging technology of Sampling Perfection with Application optimized Contrast by using different flip angle Evolutions (SPACE). A phase encoding gradient (not shown in the figure) is applied after each time one refocusing pulse is applied, then a frequency encoding gradient (not shown in the figure) is applied, and one echo acquisition (that is, acquisition of scanned signals) is carried out within the duration of the frequency encoding gradient, and a plurality of echo acquisitions can constitute an echo chain for use in the subsequent image reconstruction.

Within the waiting time of the first TR, the excited protons gradually return to the state before being excited; after the waiting time is ended, the excited protons have already returned to the state before being excited, and by then the scan within the first TR is completed. Within several subsequent consecutive TRs, the current slab can be scanned continuously and repeatedly, for example, within the second TR, the above process can be repeated, and after the scan of the second TR is ended, a next slab is then scanned, and the scanning method of the next slab is identical to that of the current slab.

It can be seen that in the 3D-TSE imaging technology provided by the prior art, only one slab can be scanned within one TR, and if it needs to scan the next slab, at least it has to wait for the next TR to come, and furthermore the length of the waiting time is far longer than that of the acquisition window within the TR, therefore, the imaging efficiency of the 3D-TSE imaging technology provided in the prior art is relatively low.

A new magnetic resonance imaging method is disclosed in a Chinese patent application with the application no. 201010160442.4, and the applicant thereof being Siemens Mindit (Shenzhen) Magnetic Resonance Co., Ltd, the entire contents of which are hereby incorporated herein by reference.

As shown in FIG. 2, more than one slab can be scanned in succession within one TR, and it might be as well to assume that three adjacent slabs (a first one, slab1, a second one, slab2 and a third one, slab3) along the slice selection direction can be scanned in succession within one TR. The time period t1-t2 is the acquisition window of the first slab within the first TR, and within the time period t1-t2, one selective excitation pulse and a plurality of selective refocusing pulses are applied in succession on the first slab, and within the time period t2-t7, the protons excited in the first slab gradually return to the state before being excited; the time period t3-t4 is the acquisition window of the second slab within the first TR, and within the time period t3-t4, one selective excitation pulse and a plurality of selective refocusing pulses are applied in succession on the second slab, and within the time period t4-t9, the protons excited in the second slab gradually return to the state before being excited; the time period t5-t6 is the acquisition window of the third slab within the first TR, and within the time period t5-t6, one selective excitation pulse and a plurality of selective refocusing pulses are applied in succession on the third slab, and within the time period t6-t11, the protons excited in the third slab gradually return to the state before being excited. It can be seen that in terms of the current slab, within the time period of waiting for the excited protons therein to return to the state before being excited, the scanning of the other slabs can be accomplished by the magnetic resonance imaging equipment. According to the above method, the acquisition time of one slab can be reduced to 2/N of the time as shown in FIG. 1, wherein N is the number of slabs, for example N=3 in FIG. 2.

However, in the magnetic resonance image obtained by the above imaging process, dark lines exist at the slab boundary, and such dark lines are referred to as slab boundary artifacts (SBA). The above Chinese patent application no. 201010160442.4 has proposed to eliminate the slab boundary artifacts by use of oversampling.

SUMMARY

The inventors have discovered that there is also a need for more technical devices to eliminate the slab boundary artifacts in the field of magnetic resonance imaging, and at least one embodiment of the present invention is precisely dedicated to proposing another technology for eliminating the slab boundary artifacts.

In view of this situation, at least one embodiment of the present invention proposes a method for processing a magnetic resonance image, so as to eliminate the SBAs in magnetic resonance images. At least one embodiment of the present invention is further intended to propose an apparatus for processing a magnetic resonance image, so as to eliminate the SBAs in magnetic resonance images. At the same time, at least one embodiment of the present invention further proposes a corresponding computer program and computer-readable medium.

At least one embodiment of the present invention provides a method for processing a magnetic resonance image, wherein said magnetic resonance image comprises a plurality of slabs, with each slab including a plurality of slices, and said method comprises: carrying out interpolation by using a slice away from a slab boundary, and substituting a slice having slab boundary artifacts existing in the slab boundary, to obtain an interpolated image; carrying out Fourier transform on said interpolated image to generate first K-space data; carrying out Fourier transform on the original image to generate second K-space data; merging the first K-space data with the second K-space data, wherein the weight of the first K-space data is greater than that of the second K-space data in the middle of the K-space, and the weight of the second K-space data is greater than that of the first K-space data at the edge of the K-space; and carrying out inverse Fourier transform on the merged K-space data.

At least one embodiment of the present invention further provides a computer program for enabling a computer to perform any one of the methods as described above.

At least one embodiment of the present invention further provides a computer-readable record medium stored with the above computer program.

At least one embodiment of the present invention further provides an apparatus for processing a magnetic resonance image, with the magnetic resonance image including a plurality of slabs and each slab including a plurality of slices, and the apparatus comprising: an interpolation unit for carrying out interpolation by using a slice away from a slab boundary, and substituting a slice having slab boundary artifacts existing in the slab boundary, to obtain an interpolated image; a first Fourier transform unit for carrying out Fourier transform on said interpolated image to generate first K-space data; a second Fourier transform unit for carrying out Fourier transform on the original image to generate second K-space data; a first merging unit for merging the first K-space data with the second K-space data, wherein the weight of the first K-space data is greater than that of the second K-space data in the middle of the K-space, and the weight of the second K-space data is greater than that of the first K-space data at the edge of the K-space; and a first inverse Fourier transform unit for carrying out inverse Fourier transform on the merged K-space data.

BRIEF DESCRIPTION OF THE DRAWINGS

In order to make the above and other features and advantages of the present invention more apparent to those skilled in the art, example embodiments of the present invention will be described in detail hereinbelow by referring to the accompanying drawings, in which.

Figure 1:
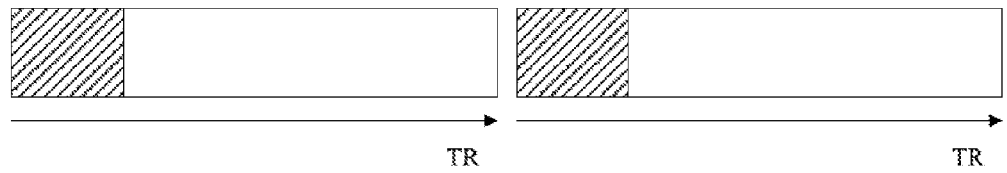
FIG. 1 is a schematic diagram of a magnetic resonance imaging method.
Figure 2:
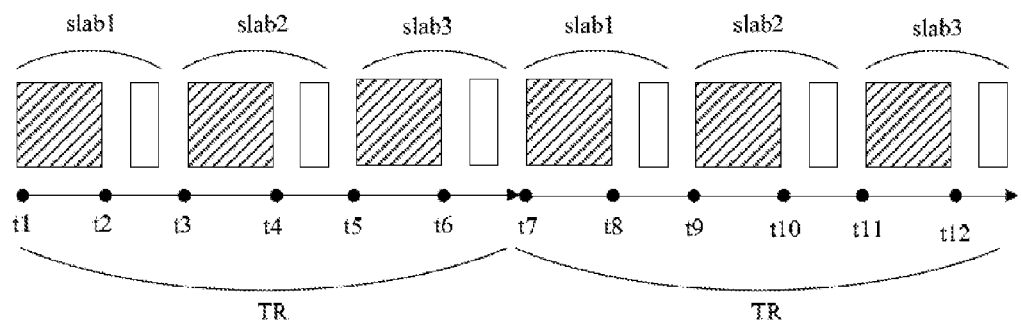
FIG. 2 is a schematic diagram of another magnetic resonance imaging method.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

In these drawings, the reference numerals are as follows:
TR: repetition time
slab1: first slab slab2: second slab slab3: third slab
t1, t2 . . . t12: time points
30: RF pulse curve
31, 32, 33: individual areas of RF pulse curve
101-105, 111-115: steps of the method
20, 40: slabs
21-24, 41-44: slices in the slab
500: apparatus for processing magnetic resonance images
501: interpolation unit
502: first Fourier transform unit
503: second Fourier transform unit
504: first merging unit
505: first inverse Fourier transform unit
511: filtering unit
512: third Fourier transform unit
513: fourth Fourier transform unit
514: second merging unit
515: second inverse Fourier transform unit

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

At least one embodiment of the present invention provides a method for processing a magnetic resonance image, wherein said magnetic resonance image comprises a plurality of slabs, with each slab including a plurality of slices, and said method comprises: carrying out interpolation by using a slice away from a slab boundary, and substituting a slice having slab boundary artifacts existing in the slab boundary, to obtain an interpolated image; carrying out Fourier transform on said interpolated image to generate first K-space data; carrying out Fourier transform on the original image to generate second K-space data; merging the first K-space data with the second K-space data, wherein the weight of the first K-space data is greater than that of the second K-space data in the middle of the K-space, and the weight of the second K-space data is greater than that of the first K-space data at the edge of the K-space; and carrying out inverse Fourier transform on the merged K-space data.

It can be seen from the above solution that since at least one embodiment of the present invention carries out the interpolation on the slices at the slab boundary during the post-processing of the image and the interpolated image and the original image are weighted and merged in K-space, the slab boundary artifacts are thereby eliminated. Furthermore, as compared with the technology in which over-sampling is achieved by changing a sequence in Chinese patent application no. 201010160442.4, at least one embodiment of the present application needs to carry out post-processing on the image without changing the sequence, therefore it is easy to implement.

According to an embodiment, 2 to 4 slices adjacent to said slice having slab artifacts are selected to carry out the interpolation. In this way, the effect of eliminating the slab boundary artifacts can be improved.

Optionally, Gaussian weighting is used in carrying out the merging.

Optionally, at least one embodiment of the method further comprises the step of carrying out normalized processing on the magnetic resonance image after the inverse Fourier transform thereon. Therefore, the changes of light and darkness in the magnetic resonance image are eliminated.

Preferably, the step of normalization processing includes: carrying out median filtering on the slice at the slab boundary in the image after the inverse Fourier transform thereon; carrying out Fourier transform on the image which has been median-filtered to generate third K-space data; carrying out Fourier transform on the image after the inverse Fourier transform thereon to generate fourth K-space data; merging the third K-space data with the fourth K-space data, wherein the weight of the third K-space data is greater than that of the fourth K-space data in the middle of the K-space, and the weight of the fourth K-space data is greater than that of the third K-space data at the edge of the K-space; and carrying out inverse Fourier transform on the merged K-space data.

At least one embodiment of the present invention further provides a computer program for enabling a computer to perform any one of the methods as described above.

At least one embodiment of the present invention further provides a computer-readable record medium stored with the above computer program.

At least one embodiment of the present invention further provides an apparatus for processing a magnetic resonance image, with the magnetic resonance image including a plurality of slabs and each slab including a plurality of slices, and the apparatus comprising: an interpolation unit for carrying out interpolation by using a slice away from a slab boundary, and substituting a slice having slab boundary artifacts existing in the slab boundary, to obtain an interpolated image; a first Fourier transform unit for carrying out Fourier transform on said interpolated image to generate first K-space data; a second Fourier transform unit for carrying out Fourier transform on the original image to generate second K-space data; a first merging unit for merging the first K-space data with the second K-space data, wherein the weight of the first K-space data is greater than that of the second K-space data in the middle of the K-space, and the weight of the second K-space data is greater than that of the first K-space data at the edge of the K-space; and a first inverse Fourier transform unit for carrying out inverse Fourier transform on the merged K-space data.

The slab boundary artifacts can be effectively eliminated by using the apparatus. Furthermore, as compared with the technology in which over-sampling is achieved by changing a sequence in Chinese patent application no. 201010160442.4, it only needs to carry out post-processing on the image without changing the sequence, therefore it is easy to implement.

Preferably, the first Fourier transform unit and second Fourier transform unit are implemented as one unit. In this way, the apparatus can be simplified and the costs can be saved.

Optionally, at least one embodiment of the apparatus further comprises: a filtering unit for carrying out median filtering on the slice at the slab boundary in the image after the inverse Fourier transform thereon; a third Fourier transform unit for carrying out Fourier transform on the image which has been median-filtered to obtain third K-space data; a fourth Fourier transform unit for carrying out Fourier transform on the image after the inverse Fourier transform thereon to obtain fourth K-space data; a second merging unit for merging the third K-space data with the fourth K-space data, wherein the weight of the third K-space data is greater than that of the fourth K-space data in the middle of the K-space, and the weight of the fourth K-space data is greater than that of the third K-space data at the edge of the K-space; and a second inverse Fourier transform unit for carrying out inverse Fourier transform on the merged K-space data. In this way, the apparatus can further eliminate the changes of light and darkness which might be introduced into a magnetic resonance image.

Preferably, the third Fourier transform unit and fourth Fourier transform unit are implemented as one unit; and/or said second merging unit and first merging unit are implemented as one unit; and/or said second inverse Fourier transform unit and first inverse Fourier transform unit are implemented as one unit. In this way, the apparatus can be further simplified and the costs can be saved.

It can be seen from the above solution, that since at least one embodiment of the present invention carries out the interpolation on the slices at the slab boundary during the post-processing of the image and the interpolated image and the original image are weighted and merged in K-space, the slab boundary artifacts are thereby eliminated. Furthermore, as compared with the technology in which over-sampling is achieved by changing a sequence in Chinese patent application no. 201010160442.4, at least one embodiment of the present application needs to carry out the post-processing without changing the sequence, therefore it is easy to implement.

In order to make the object, technical solutions and advantages of the present invention more apparent, the present invention will be further described in detail hereinbelow by way of embodiments.

It has been found by research efforts that the generation of slab boundary artifacts in a magnetic resonance image is related to the RF pulse curve in the direction of phase encoding gradient. The RF pulse curve in the direction of phase encoding gradient is not constant during each echo acquisition, that is to say, during each echo acquisition, the signal strength and contrast of the RF pulse in the direction of phase encoding gradient are not constant.

Figure 3:
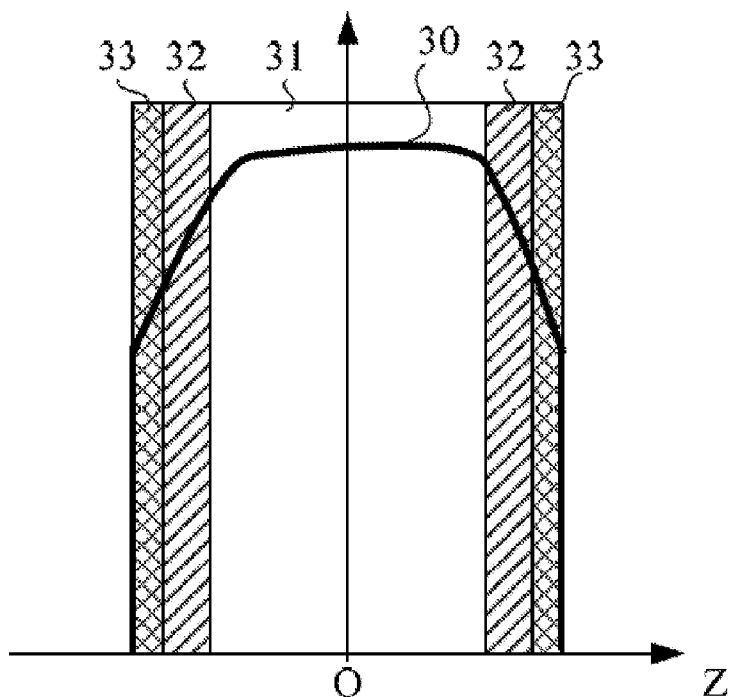
FIG. 3 is a waveform diagram of a radio frequency pulse.

As shown in FIG. 3, most of an area 31 in the middle of the RF pulse curve 30 in the direction of phase encoding gradient is substantially constant, and the signal strength and contrast are both correct. In hatched areas 32 on both sides, the RF pulse 30 in the direction of phase encoding gradient gradually falls, and the signal strength changes but the contrast is still correct. In grid line areas 33 at the edges, the RF pulse 30 in the direction of phase encoding gradient becomes worse, and both the signal strength and the contrast change, which results in that the echo signals at the slab edge are lower than those in the middle of the slab, thus dark lines exist at the slab edge and slab boundary artifacts are formed.

This embodiment proposes a method for eliminating slab boundary artifacts during post-processing. In this embodiment, a magnetic resonance image includes a plurality of slabs in the slice selection direction, and each slab includes a plurality of slices. For example, in FIG. 5, it is shown that two adjacent slabs 20 and 40 of the magnetic resonance image are in the slice selection direction, and slabs 20 and 40 include 4 slices respectively. "4" is only used here as an example and does not limit the particular number of slices to be included in a slab of the technical solution.

Figure 4:
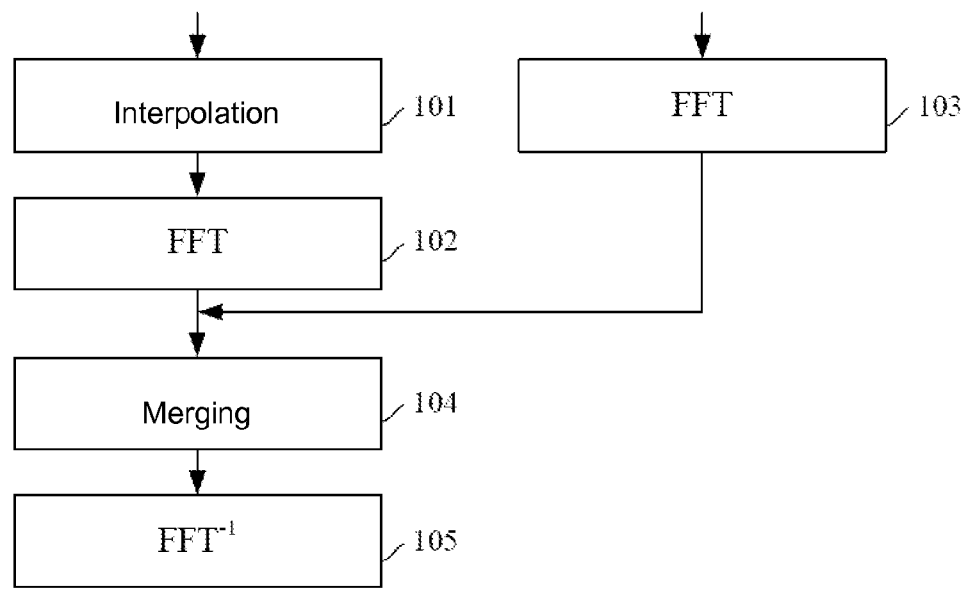
FIG. 4 is a schematic flow chart of a method according to an embodiment of the present invention.

As shown in FIG. 4, the method according to this embodiment includes the steps as follows:

Step 101, as to an original image with slab boundary artifacts, interpolation is carried out by using a slice remote or distant from a slab boundary to substitute a slice having slab boundary artifacts existing in the slab boundary, so as to obtain an interpolated image.

Figure 5:
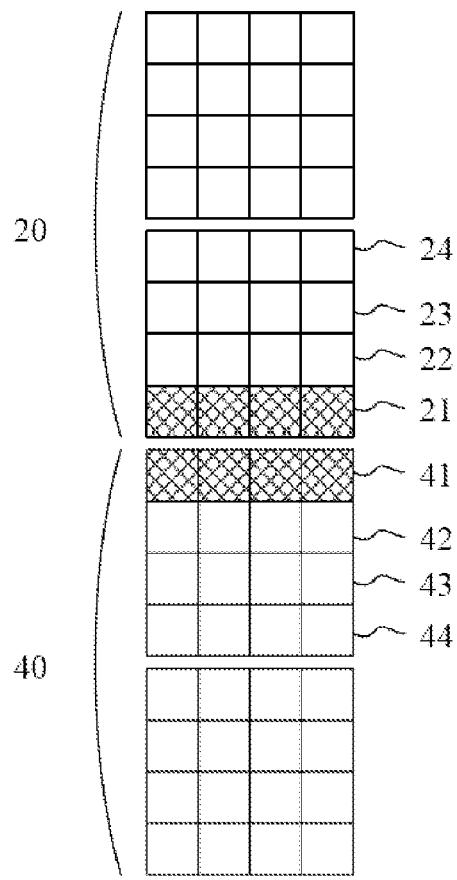
FIG. 5 is a schematic diagram of interpolation.

Referring to FIG. 5, a slice 21 at the boundary of the slab 20 and a slice 41 at the boundary of the slab 40 generally correspond to the portions where the RF pulse curve 30 is in the area 33 in FIG. 3, namely slices 21 and 41 have slab boundary artifacts. A slice 22 of the slab 20 and a slice 42 of the slab 40 generally correspond to the portions where the RF pulse curve is in the area 32 in FIG. 3. Slices 23 and 24 of the slab 20 and slices 43 and 44 of the slab 40 generally correspond to the portions where the RF pulse curve is in the area 31 in FIG. 3.

In this step, pixels in slices 22 and 42 can be used to carry out the interpolation and to substitute the original pixels in slices 21 and 41. Of course, more slices (such as slices 22, 23, 42 and 43) can also be used to carry out the interpolation, thereby the effects in eliminating slab boundary artifacts can be further improved.

In this embodiment, the interpolation can be carried out by using various currently available methods, such as linear interpolation, etc.

Step 102, Fourier transform is carried out on the interpolated image and preferably fast Fourier transform (FFT) is used to obtain first K-space data.

Step 103, Fourier transform is carried out on the original image and preferably FFT is used to obtain second K-space data.

It needs to be noted that there is no requirement to the sequence of steps 101-102 and step 103 in this embodiment.

Step 104, the first K-space data is merged with the second K-space data.

Figure 6:
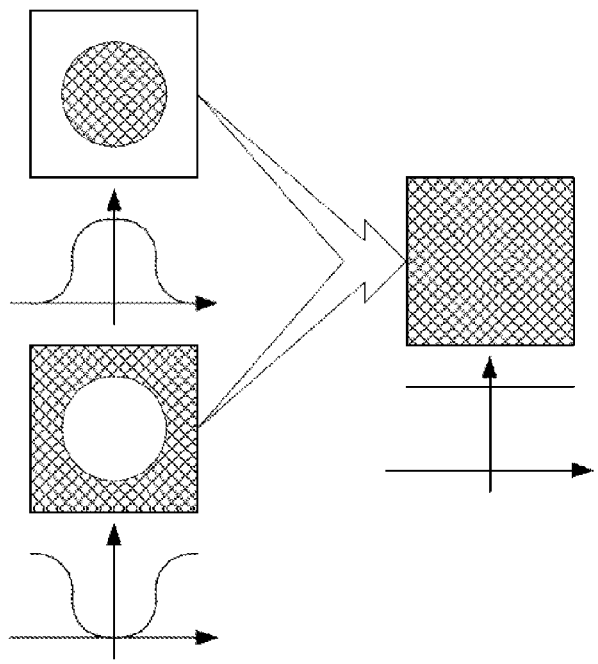
FIG. 6 is a schematic diagram of merging.

Referring to FIG. 6, in this embodiment, one needs to retain more of the first K-space data in the middle of the merged K-space data (top left in FIG. 6) and to retain more of the second K-space data at the edge of the merged K-space data (bottom left in FIG. 6). That is to say, the weight of the first K-space data is made greater than that of the second K-space data in the middle of the K-space, and the weight of the second K-space data greater than that of the first K-space data at the edge of the K-space.

During this merging, Gaussian weighting can be used in carrying out the above merging and other weighting methods can also be used in carrying out the merging. FIG. 6 shows a schematic diagram of a weighted merging therein.

Step 105, inverse Fourier transform is carried out on the merged K-space data (preferably fast inverse Fourier transform FFT-1 is used), so as to obtain a magnetic resonance image with the slab boundary artifacts thereof being eliminated.

After the above processing, the slab boundary artifacts are eliminated, but it is possible to introduce the change of light and darkness in the magnetic resonance image, namely in the magnetic resonance image, some areas appear darker than other areas, and especially the slab boundaries appear even darker. For this reason, according to another embodiment of the present invention, the step of normalized processing can be further carried out.

The process of normalized processing is described by taking the median filtering technology as an example in this embodiment, however, those skilled in the art can use other equivalent or similar technologies to carry out the normalized processing.

Figure 7:
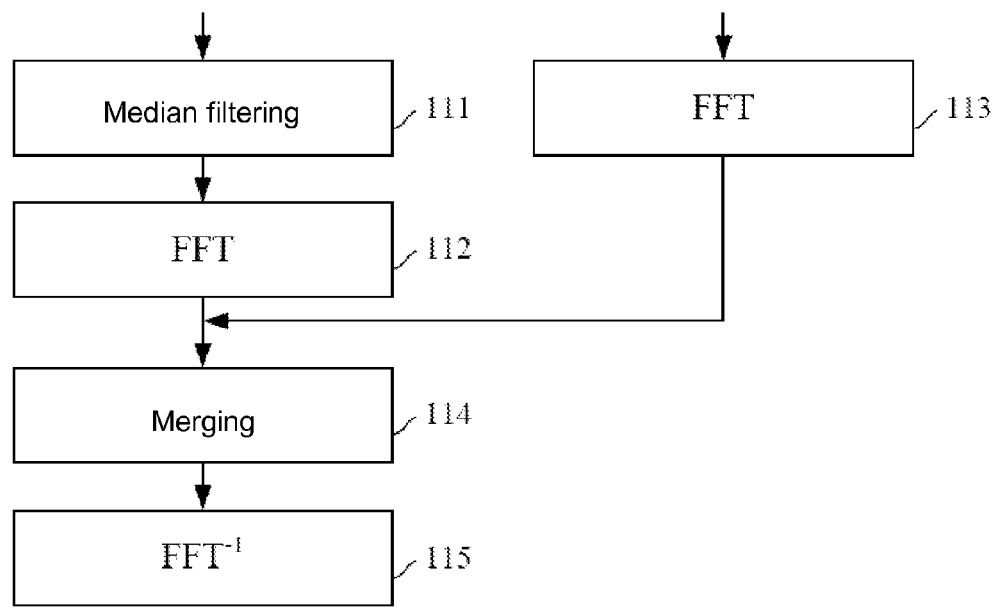
FIG. 7 is a schematic flow chart of a method according to another embodiment of the present invention.

Referring to FIG. 7, the process of normalized processing includes:

Step 111, in the magnetic resonance image obtained in step 105, median filtering is carried out on the slice at the slab boundary. The so-called median filtering refers to setting the pixel value of a pixel point in the slice at the slab boundary as a median of the pixel values of all pixel points in one certain neighborhood window of the point. For example, a window of 2×2, 3×3. . . , or 6×6 can be selected for use.

Step 112, Fourier transform is carried out on the image which has been median-filtered, so as to obtain third K-space data.

Step 113, Fourier transform is carried out on the image after the inverse Fourier transform thereon in step 105, so as to obtain fourth K-space data.

It also needs to be noted that there is no requirement to the sequence of steps 111-112 and step 113 in this embodiment. Preferably, fast Fourier transform is also used here.

Step 114, the third K-space data is merged with the fourth K-space data. Similar to the above step 104, in this embodiment, it needs to reserve more of the third K-space data in the middle of the merged K-space data and more of the fourth K-space data at the edge of the merged K-space data. That is, the weight of the third K-space data is greater than that of the fourth K-space data in the middle of the K-space, and the weight of the fourth K-space data is greater than that of the third K-space data at the edge of the K-space.

Likewise, during the merging, as shown in FIG. 6, Gaussian weighting can be used in carrying out the above merging and other weighting methods can also be used in the merging.

Step 115, inverse Fourier transform is carried out on the merged K-space data, so as to obtain a magnetic resonance image with the change of light and darkness therein being eliminated.

A computer program is provided according to still another embodiment of the present invention, and the computer program enables a computer to perform the above magnetic resonance image processing method.

In addition, a computer-readable record medium is further provided, and the computer-readable record medium is stored with the above computer program.

According to yet another embodiment of the present invention, an apparatus for processing a magnetic resonance image is provided to eliminate slab boundary artifacts in the magnetic resonance images. In this case, the magnetic resonance image includes a plurality of slabs in the slice selection direction, and each slab includes a plurality of slices.

Figure 8:
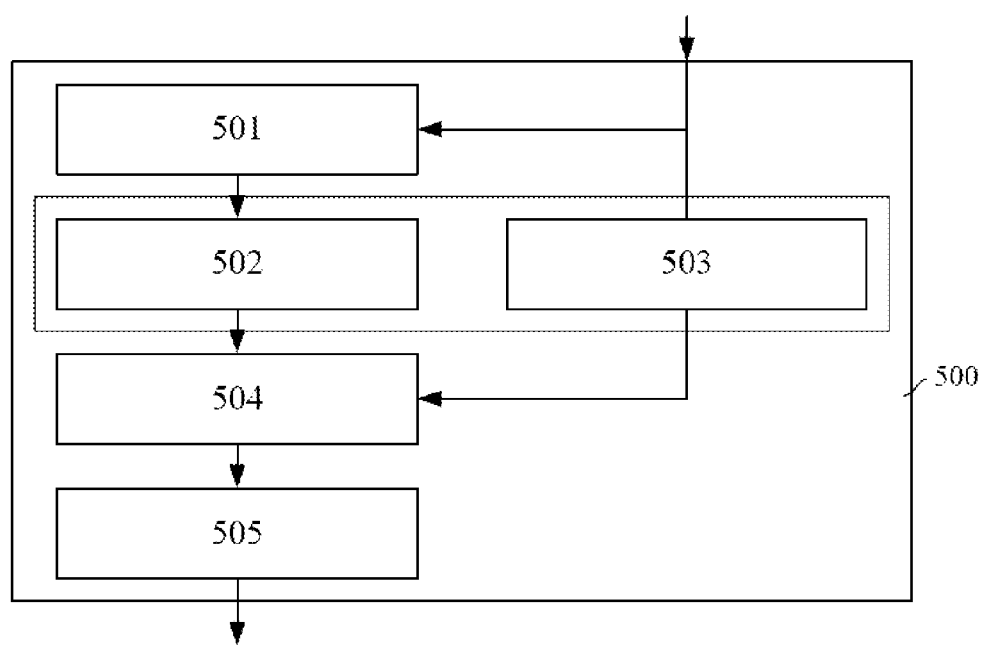
FIG. 8 is a schematic structural diagram of an apparatus according to yet another embodiment of the present invention.

Referring to FIG. 8, a magnetic resonance image processing apparatus 500 comprises an interpolation unit 501, a first Fourier transform unit 201, a second Fourier transform unit 503, a first merging unit 504 and a first inverse Fourier transform unit 505.

Referring to FIG. 8, the interpolation unit 501 is used for carrying out interpolation in an original image by using a slice away from a slab boundary to substitute a slice having slab boundary artifacts existing in the slab boundary, so as to obtain an interpolated image.

The first Fourier transform unit 502 is used for carrying out Fourier transform on the interpolated image obtained by the interpolation unit 501, to obtain first K-space data. And the second Fourier transform unit 503 is used for carrying out Fourier transform on the original image to obtain second K-space data. The first Fourier transform unit 502 and the second Fourier transform unit 503 can be implemented as one unit, for example, as represented by a block in FIG. 8.

The first merging unit 504 is used for merging the first K-space data from the first Fourier transform 502 with the second K-space data from the second Fourier transform 503. In this case, the weight of the first K-space data is greater than that of the second K-space data in the middle of the K-space, and the weight of the second K-space data is greater than that of the first K-space data at the edge of the K-space. The particular implementation of the first merging unit 504 can refer to the method described in the previous embodiments.

The first inverse Fourier transform unit 505 is used for carrying out inverse Fourier transform on the merged K-space data by the first merging unit 504 to obtain the magnetic resonance image with the slab boundary artifacts being eliminated.

Figure 9:
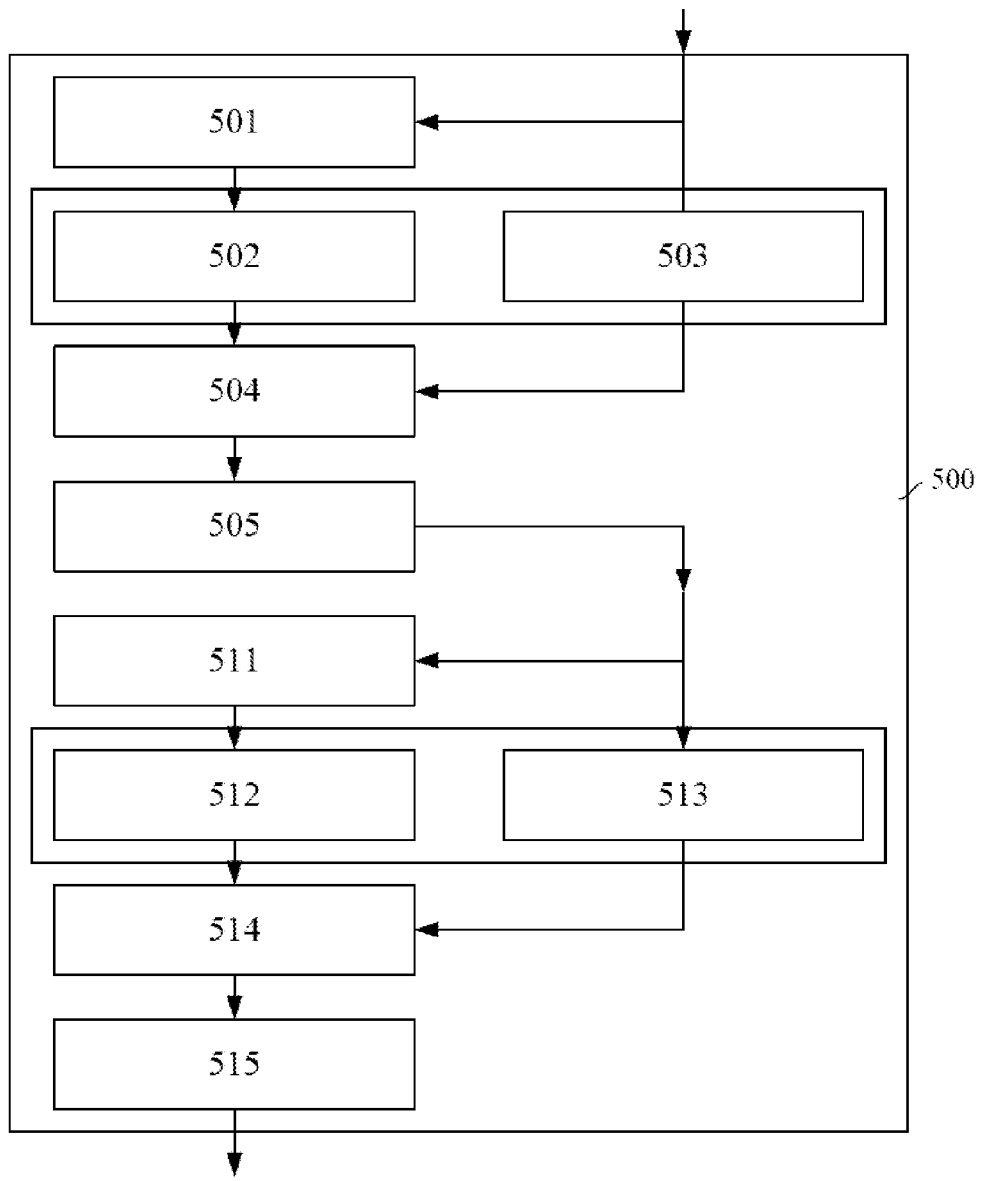
FIG. 9 is a schematic structural diagram of an apparatus according to still yet another embodiment of the present invention.

Furthermore, referring to FIG. 9, the magnetic resonance image processing apparatus 500 according to yet another embodiment further comprises a filtering unit 511, a third Fourier transform unit 512, a fourth Fourier transform unit 513, a second merging unit and a second inverse Fourier transform unit 515.

Continuing to refer to FIG. 9, the filtering unit 511 is used for carrying out median filtering on the slices at the slab boundaries in the image obtained by the first inverse Fourier transform 505.

The third Fourier transform unit 512 is used for carrying out Fourier transform on the image which has been median-filtered to obtain the third K-space data. The fourth Fourier transform unit 513 is used for carrying out Fourier transform on the magnetic resonance image obtained by the first inverse Fourier transform unit 505 to obtain the fourth K-space data. Likewise, the third Fourier transform unit 512 and the fourth Fourier transform unit 513 can be implemented as one unit, as shown by a block in FIG. 9.

In addition, the first Fourier transform unit 502, the second Fourier transform unit 503, the third Fourier transform unit 512 and the fourth Fourier transform unit 513 can be implemented as one unit.

The second merging unit 514 is used for merging the third K-space data with the fourth K-space data, wherein the weight of the third K-space data is greater than that of the fourth K-space data in the middle of the K-space, and the weight of the fourth K-space data is greater than that of the third K-space data at the edge of the K-space. The first merging unit 504 and second merging unit 514 can also be implemented as one unit (not shown in the figure).

The second inverse Fourier transform unit 515 is used for carrying out inverse Fourier transform on the merged K-space data. The first inverse Fourier transform unit 505 and second inverse Fourier transform unit 515 can be implemented as one unit (not shown in the figure).

The embodiments of the present invention have disclosed a magnetic resonance image processing method, a magnetic resonance image processing apparatus, a computer program for implementing said method and a computer-readable record medium for storing the program. In this case, at least one embodiment of the method comprises: carrying out interpolation by using a slice away from a slab boundary and substituting a slice having slab boundary artifacts existing in the slab boundary, to obtain an interpolated image; carrying out Fourier transform on the interpolated image to generate first K-space data; carrying out Fourier transform on the original image to generate second K-space data; merging the first K-space data with the second K-space data, wherein the weight of the first K-space data is greater than that of the second K-space data in the middle of the K-space, and the weight of the second K-space data is greater than that of the first K-space data at the edge of the K-space; and carrying out inverse Fourier transform on the merged K-space data. The slab boundary artifacts in magnetic resonance images can be effectively eliminated by the implementation of the present invention.

What are described above are merely example embodiments of the present invention, and are not to limit the present invention, and any modifications, equivalents and improvements within the spirit and principle of the present invention should be covered by the protection scope of the present invention.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention.

Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for processing a magnetic resonance image, wherein said magnetic resonance image comprises a plurality of slabs, each of the plurality of slabs including a plurality of slices, said method comprising:
   carrying out interpolation by using a slice away from a slab boundary in an original image, and substituting a slice having slab boundary artifacts existing in the slab boundary, to obtain an interpolated image;
   carrying out Fourier transform on said interpolated image to generate first K-Space data;
   carrying out Fourier transform on the original image to generate second K-space data;
   merging the first K-space data with the second K-space data, wherein a weight of the first K-space data is relatively greater than that of the second K-space data in a middle of the K-space, and a weight of the second K-space data is relatively greater than that of the first K-space data at an edge of the K-space; and
   carrying out inverse Fourier transform on the merged K-space data.

2. The method as claimed in claim 1, wherein 2 to 4 slices adjacent to said slice having slab artifacts are selected to carry out the interpolation.

3. The method as claimed in claim 1, wherein Gaussian weighting is used in carrying out said merging.

4. The method as claimed in claim 1, further comprising carrying out normalized processing on the magnetic resonance image after the inverse Fourier transform is carried out.

5. The method as claimed in claim 4, wherein said carrying out of the normalized processing comprises:
   carrying out median-filtering on the slice at the slab boundary in the image after the inverse Fourier transform I carried out;
   carrying out Fourier transform on the image which has been median-filtered to generate third K-space data;
   carrying out Fourier transform on the image after the inverse Fourier transform is carried out to generate fourth K-space data;
   merging the third K-space data with the fourth K-space data, wherein a weight of the third K-space data is relatively greater than that of the fourth K-space data in a middle of the K-space, and a weight of the fourth K-space data is relatively greater than that of the third K-space data at an edge of the K-space; and
   carrying out inverse Fourier transform on the merged third and fourth K-space data.

6. A non-transitory computer readable medium including program segments for, when executed on a computer device, causing the computer device to implement the method of claim 1.

7. A non-transitory computer readable medium including program segments for, when executed on a computer device, causing the computer device to implement the method of claim 5.

8. An apparatus for processing a magnetic resonance image, said magnetic resonance image comprising a plurality of slabs and each of the plurality of slabs including a plurality of slices, said apparatus comprising:
- an interpolation unit to carry out interpolation by using a slice away from a slab boundary in an original image, and substituting a slice having slab boundary artifacts existing in the slab boundary, to obtain an interpolated image;
- a first Fourier transform unit to carry out Fourier transform on said interpolated image to obtain first K-space data;
- a second Fourier transform unit to carry out Fourier transform on the original image to obtain second K-space data;
- a first merging unit to merge the first K-space data with the second K-space data, wherein a weight of the first K-space data is relatively greater than that of the second K-space data in a middle of the K-space, and a weight of the second K-space data is relatively greater than that of the first K-space data at the edge of the K-space; and
- a first inverse Fourier transform unit to carry out inverse Fourier transform on the merged K-space data.

9. The apparatus as claimed in claim 8, wherein said first Fourier transform unit and said second Fourier transform unit are implemented as one unit.

10. The apparatus as claimed in claim 8, further comprising:
- a filtering unit to carry out median-filtering on the slice at the slab boundary in the image after the inverse Fourier transform;
- a third Fourier transform unit to carry out Fourier transform on the image which has been median-filtered to obtain third K-space data;
- a fourth Fourier transform unit to carry out Fourier transform on the image after the inverse Fourier transform to obtain fourth K-space data;
- a second merging unit to merge the third K-space data with the fourth K-space data, wherein a weight of the third K-space data is relatively greater than that of the fourth K-space data in a middle of the K-space, and a weight of the fourth K-space data is relatively greater than that of the third K-space data at the edge of the K-space; and
- a second inverse Fourier transform unit to carry out the inverse Fourier transform on the merged third and fourth K-space data.

11. The apparatus as claimed in claim 10, wherein at least one of
- said third Fourier transform unit and fourth Fourier transform unit are implemented as one unit; and
- said second merging unit and first merging unit are implemented as one unit; and
- said second inverse Fourier transform unit and first inverse Fourier transform unit are implemented as one unit.

12. The apparatus as claimed in claim 9, further comprising:
- a filtering unit to carry out median-filtering on the slice at the slab boundary in the image after the inverse Fourier transform;
- a third Fourier transform unit to carry out Fourier transform on the image which has been median-filtered to obtain third K-space data;
- a fourth Fourier transform unit to carry out Fourier transform on the image after the inverse Fourier transform to obtain fourth K-space data;
- a second merging unit to merge the third K-space data with the fourth K-space data, wherein a weight of the third K-space data is relatively greater than that of the fourth K-space data in a middle of the K-space, and a weight of the fourth K-space data is relatively greater than that of the third K-space data at the edge of the K-space; and
- a second inverse Fourier transform unit to carry out the inverse Fourier transform on the merged third and fourth K-space data.

13. The apparatus as claimed in claim 12, wherein at least one of
- said third Fourier transform unit and fourth Fourier transform unit are implemented as one unit; and
- said second merging unit and first merging unit are implemented as one unit; and
- said second inverse Fourier transform unit and first inverse Fourier transform unit are implemented as one unit.

* * * * *